United States Patent
Andrews

(10) Patent No.: US 7,405,093 B2
(45) Date of Patent: Jul. 29, 2008

(54) METHODS OF ASSEMBLY FOR A SEMICONDUCTOR LIGHT EMITTING DEVICE PACKAGE

(75) Inventor: Peter Andrews, Durham, NC (US)

(73) Assignee: Cree, Inc., Durham, NC (US)

(*) Notice: Subject to any disclaimer, the term of this patent is extended or adjusted under 35 U.S.C. 154(b) by 722 days.

(21) Appl. No.: 10/920,613

(22) Filed: Aug. 18, 2004

(65) Prior Publication Data

US 2006/0063287 A1   Mar. 23, 2006

(51) Int. Cl.
  *H01L 21/00* (2006.01)
(52) U.S. Cl. .................................. 438/26; 438/106
(58) Field of Classification Search .................. 438/26, 438/106, 108
  See application file for complete search history.

(56) References Cited

U.S. PATENT DOCUMENTS

| | | | |
|---|---|---|---|
| 5,773,898 A | | 6/1998 | Kobayashi |
| 6,027,957 A | * | 2/2000 | Merritt et al. ............... 438/106 |
| 6,498,355 B1 | * | 12/2002 | Harrah et al. ................ 257/99 |
| 2002/0104877 A1 | | 8/2002 | Morimoto et al. |
| 2002/0142517 A1 | * | 10/2002 | Maeda et al. ............... 438/108 |
| 2003/0045015 A1 | * | 3/2003 | Slater et al. ............... 438/26 |
| 2004/0041222 A1 | | 3/2004 | Loh ........................ 257/433 |
| 2006/0208041 A1 | * | 9/2006 | MacKay et al. ............. 228/254 |

FOREIGN PATENT DOCUMENTS

| | | |
|---|---|---|
| EP | 0 586 243 A1 | 3/1994 |
| EP | 0 981 152 A2 | 2/2000 |
| EP | 1 544 923 A2 | 12/2004 |
| JP | 2002-344020 | 11/2002 |

OTHER PUBLICATIONS

Oppermann et al. The Assembly of Optoelectronic Components *SDSS MictroTec* 1-6; presented at SMT/Hybrid/Packaging (2002).
International Search Report and Written Opinion for PCT/US2005/028007; Date of mailing Jul. 19, 2006.

* cited by examiner

*Primary Examiner*—Trung Dang
(74) *Attorney, Agent, or Firm*—Myers Bigel Sibley & Sajovec

(57) ABSTRACT

Methods of assembly for a semiconductor light emitting device package may include positioning a submount on a mounting substrate with a solder material and a flux therebetween. The semiconductor light emitting device is positioned on a top side of the submount with a solder material and a flux therebetween to provide an assembled stack that has not been reflowed. The assembled stack is reflowed to attach the submount to the mounting substrate and the light emitting device to the submount.

22 Claims, 7 Drawing Sheets

METHODS OF ASSEMBLY FOR A SEMICONDUCTOR LIGHT EMITTING DEVICE PACKAGE

BACKGROUND OF THE INVENTION

This invention relates to microelectronic devices and fabrication methods therefor, and more particularly to light emitting devices, such as light emitting diodes (LEDs) and manufacturing methods therefor.

Light emitting diodes are widely used in consumer and commercial applications. As is well known to those having skill in the art, a light emitting diode generally includes a diode region on a microelectronic substrate. The microelectronic substrate may comprise, for example, gallium arsenide, gallium phosphide, alloys thereof, silicon carbide and/or sapphire. Continued developments in LEDs have resulted in highly efficient and mechanically robust light sources that can cover the visible spectrum and beyond. These attributes, coupled with the potentially long service life of solid state devices, may enable a variety of new display applications, and may place LEDs in a position to compete with the well entrenched incandescent and fluorescent lamps.

Gallium Nitride (GaN)-based LEDs typically include an insulating or semiconducting substrate, such as silicon carbide (SiC) or sapphire, on which a plurality of GaN-based epitaxial layers are deposited. The epitaxial layers include an active or diode region having a p-n junction which emits light when energized.

LEDs may be mounted substrate side down onto a submount, also called a package or lead frame (hereinafter referred to as a "submount"). In contrast, flip-chip mounting of light emitting diodes involves mounting the LED onto the submount with the substrate side facing up (i.e. away from the submount). Light may be extracted and emitted through the substrate. Flip chip mounting may be an especially desirable technique for mounting SiC-based LEDs. In particular, because SiC has a higher index of refraction than GaN, light generated in the active or diode region generally does not totally internally reflect (i.e. reflect back into the GaN-based layers) at the GaN/SiC interface. Flip chip mounting of SiC-based LEDs also can improve the effect of certain substrate-shaping techniques known in the art. Flip chip packaging of SiC LEDs may have other benefits, such as improved heat dissipation, which may be desirable depending on the particular application for the LED.

One potential problem with flip-chip mounting is that when an LED is mounted on a submount using conventional techniques, a conductive die attach material such as silver epoxy is deposited on the LED and/or on the package, and the LED and the submount are pressed together. This can cause the viscous conductive die attach material to squeeze out and make contact with the N-type substrate and/or layers in the device, thereby forming a Schottky diode connection that can short-circuit the p-n junction in the active region.

Metal-metal bonds formed by soldering, thermosonic scrubbing and/or thermocompression bonding are alternative attach techniques. However, tin (Sn) is a component of most types of solder, and migration of Sn from the bonded surface into the device can cause unwanted degradation of the device. Such migration can interfere with metal-semiconductor interfaces such as ohmic contacts and/or the function of metal-metal interfaces such as reflective interfaces that serve as mirrors.

Semiconductor light emitting devices, such as LEDs, may be first attached to a submount and then the submount may be mounted to a substrate. So as to distinguish the substrate to which the submount is mounted from the semiconductor substrate on which the light emitting device is fabricated, the substrate to which the submount is mated will be referred to herein as a "mounting substrate." The mounting substrate may, in turn, be mounted to a circuit board or other electrical circuit depending upon the particular application for the LED. Each of these connections typically includes both electrical and physical connection aspects.

A common form of connection used for mounting an LED to a submount and a submount to a mounting substrate is soldering using, for example, a die solder process. Soldering may be used to provide a metal-to-metal connection providing mechanical mounting, a thermal pathway and an electrical connection. Solder materials may generally be categorized as low temperature, medium temperature and high temperature solders. The temperature categorization may be based on the eutectic temperature of a particular composition. For example, a silver-tin (AgSn) alloy with eighty percent (80%) silver generally has an associated solder temperature of about 220 degrees centigrade (° C.), making it a medium temperature solder material. A high temperature solder material may be, for example, gold-tin (AuSn) having a solder temperature of about 280° C. A low temperature solder may be, for example, lead-tin (PbSn) having a solder temperature of about 180° C.

It is generally preferable not to reflow a previously formed solder connection. Thus, in applications involving multiple solder reflow process steps, different temperature solder materials may be selected so that subsequent reflow process steps do not detrimentally impact previously formed solder bonds. For example, it is known to use a high temperature solder material to connect an LED to a submount in combination with a medium temperature solder material for connecting the submount to a mounting substrate. A low temperature solder material may then be used for connecting the mounting substrate to a circuit board. Thus, each subsequent process step may be carried out at a temperature below the reflow temperature for the previously formed solder connection. However, it is also known to use a high temperature solder material to connect an LED to a submount and then a high temperature material to connect the submount to a substrate and then a medium temperature solder material to connect the assembly to a circuit board and a low temperature to connect the circuit board to a mother board.

It is also known to use a medium temperature solder for the LED to submount connection in combination with a low temperature solder for the submount to mounting substrate connection. The mounting substrate may then be connected to the circuit board using a low temperature solder but in a manner that reduces the heating of the submount to mounting substrate connection to avoid reflow of that connection in the later process. For example, the mounting substrate may be mounted to the circuit board using standoffs providing thermal isolation from the heat used to solder the standoffs to the circuit board. Similarly, it has been proposed to use leads offset to the side from the submount to provide thermal isolation of the LED to submount solder bond from the heat generated when soldering the submount leads to the circuit board. However, these various approaches may not be compatible with higher density circuit board mounting techniques, particularly in surface mount applications that are generally used where higher density mounting of components on the circuit board is desired.

It is known to use automated machines to produce submount mounted LEDs. In such apparatus, the LEDs may be provided on a tape. A punch (ejector pin) is typically used to push an LED off of the carrier tape into a chuck (collet). The chuck is generally attached to a pick and place mechanism used to move the LED from the tape to place it in a desired position on a submount for soldering thereto. While the punch is generally designed to have a rounded contact surface to reduce the potential for damage to the LED during contact, in use, a punch may be damaged and develop sharp edges, which are a greater risk for causing damage to an LED. This may be particularly problematic for flip-chip mounting applications, where the LED is generally provided on the carrier tape with the epitaxial layer side (epi-side) down to simplify the placement mechanics used by the chuck to move the LED into position with the epi-side down on the submount. Various known defects may be introduced when cracks are presented in one or more of the epi-side layers of the LED as described, for example, in U.S. patent application Ser. No. 10/002,244, which is incorporated herein by reference. Such cracks may be introduced by a punch, particularly where the punch has any sharp edged features, for epi-side down carrier tape applications used in flip-chip mounting of LEDs.

SUMMARY OF THE INVENTION

Some embodiments of the present invention provide methods of assembly for a semiconductor light emitting device package. A submount is positioned on a mounting substrate with a solder material and a flux therebetween. The semiconductor light emitting device is positioned on a top side of the submount with a solder material and a flux therebetween to provide an assembled stack that has not been reflowed. The assembled stack is reflowed to attach the submount to the mounting substrate and the light emitting device to the submount.

In further embodiments of the present invention, positioning a submount on a mounting substrate with a solder material and a flux therebetween includes positioning a submount on a mounting substrate with a solder paste therebetween and positioning the semiconductor light emitting device on a top side of the submount with a solder material and a flux therebetween includes forming a solder material layer on at least one of the semiconductor light emitting device and the top side of the submount. The solder paste may be disposed on the mounting substrate and the flux may be disposed on the top side of the submount, displaced from the mounting substrate, with the flux contacting the solder material layer.

In other embodiments of the present invention, a solder paste may be disposed on a mounting substrate. A submount is positioned on the mounting substrate with the solder paste therebetween. A flux and a solder material may be disposed on a top side of the submount, displaced from the mounting substrate. The semiconductor light emitting device is positioned on the top side of the submount with the flux and the solder material therebetween. The light emitting device may have the solder material on a side thereof contacting the flux. The submount, mounting substrate and light emitting device with the flux and solder paste provide an assembled stack that has not been reflowed. The assembled stack is reflowed to attach the submount to the mounting substrate and the light emitting device to the submount.

In some embodiments of the present invention, reflowing the assembled stack includes heating the assembled stack in an oven to a temperature and at a rate selected to provide a metal to metal bond between the mounting substrate and the submount and between the submount and the light emitting device. As used herein, references to heating the assembled stack to a temperature refer to a temperature attained by the solder materials in the assembled stack. The metal to metal bonds may be high temperature solder bonds. The solder paste may be a gold-tin (AuSn) solder paste and the solder material on the light emitting device may be AuSn. The temperature may be at least about 300° C. The light emitting device may be a light emitting diode (LED).

In other embodiments of the present invention, reflowing the assembled stack is followed by soldering the reflowed assembled stack to a circuit board, without reflowing attachment of the submount to the mounting substrate or of the light emitting device to the submount, using a medium or low temperature solder. Disposing a solder paste may include disposing the solder paste on a contact pad on a top side of the mounting substrate. Disposing a flux may include placing a flux dot on a contact pad on the top side of the submount.

In further embodiments of the present invention, methods of assembly for a semiconductor light emitting device package include providing a mounting substrate, a high temperature solder backside terminated submount, a high temperature solder terminated semiconductor light emitting device, a high temperature solder paste and a solder flux to a pick and place assembly apparatus. The pick and place apparatus dispenses the high temperature solder paste on the mounting substrate, places the submount with a bottom face thereof on the mounting substrate with the dispensed solder paste therebetween, dispenses the flux on a top face of the submount, places the light emitting device on the submount with the flux therebetween, the light emitting device having a high temperature solder material deposited on a face thereof contacting the dispensed flux, to provide an unsoldered assembled stack; and then provides the assembled stack for heating in a reflow oven. The reflow oven reflows the assembled stack. The reflow may be in a nitrogen ($N_2$) atmosphere.

In other embodiments of the present invention, reflowing the assembled stack is followed by flux cleaning the reflowed assembled stack. Placing the light emitting device may include flipping the light emitting device before placing the light emitting device on the submount. The light emitting device may be provided to the pick and place machine on a carrier tape.

In further embodiments of the present invention, the light emitting device is positioned on a carrier tape with an epi-layer side thereof up. Placing the light emitting device includes punching the light emitting device off the carrier tape to a first chuck with a punch pin without contacting the epi-layer side of the light emitting device with the punch pin. The light emitting device is moved from the first chuck to a second chuck to flip the light emitting device. The light emitting device is placed on the submount with the second chuck.

In other embodiments of the present invention, methods of placing a light emitting device on a mounting surface, such as a submount, include providing the light emitting device positioned on a carrier tape with an epi-layer side of the light emitting device up. The light emitting device is punched off the carrier tape to a first chuck with a punch pin without contacting the epi-layer side of the light emitting device with the punch pin. The light emitting device is moved from the first chuck to a second chuck to flip the light emitting device and is placed on the mounting surface with the second chuck.

DETAILED DESCRIPTION

Figure 1A:
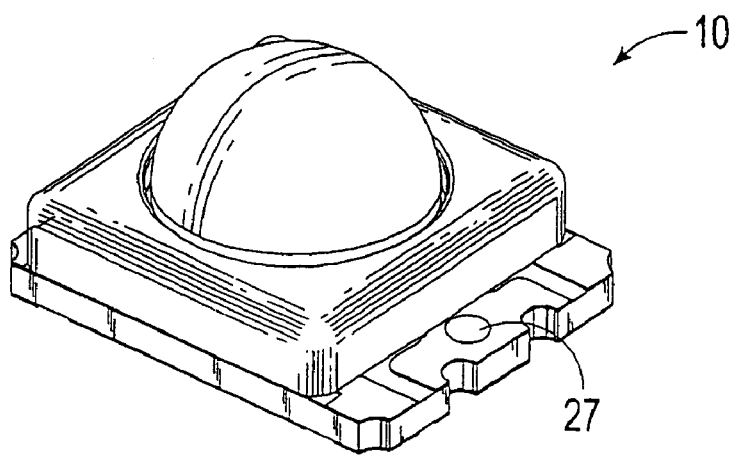
FIG. 1A is a perspective view of semiconductor die package that may be assembled according to various embodiments of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As will also be appreciated by those of skill in the art, while the present invention is described with respect to semiconductor wafers and diced chips, such chips may be diced into arbitrary sizes. Accordingly, the present invention is not limited to the relative size and spacing illustrated in the accompanying figures. In addition, certain features of the drawings are illustrated in exaggerated dimensions for clarity of drawing and ease of explanation.

As used herein, the term "semiconductor light emitting device" may include a light emitting diode, laser diode and/or other semiconductor device which includes one or more semiconductor layers, which may include silicon, silicon carbide, gallium nitride and/or other semiconductor materials, a mounting substrate which may include sapphire, silicon, silicon carbide and/or other microelectronic mounting substrates, and one or more contact layers which may include metal and/or other conductive layers. In some embodiments, ultraviolet, blue and/or green light emitting diodes ("LEDs") may be provided.

Some embodiments of the present invention now will be described, generally with reference to gallium nitride-based light emitting diodes on silicon carbide-based mounting substrates for ease of understanding the description herein. However, it will be understood by those having skill in the art that other embodiments of the present invention may be based on a variety of different combinations of mounting substrate and epitaxial layers. For example, combinations can include AlGaInP diodes on GaP mounting substrates; InGaAs diodes on GaAs mounting substrates; AlGaAs diodes on GaAs mounting substrates; SiC diode on SiC or sapphire ($Al_2O_3$) mounting substrate and/or a nitride-based diode on gallium nitride, silicon carbide, aluminum nitride, sapphire, zinc oxide and/or other mounting substrates.

Thus, for example, the semiconductor light emitting device may be a gallium nitride-based LED or laser fabricated on a silicon carbide mounting substrate, such as those devices manufactured and sold by Cree, Inc. of Durham, N.C. The present invention may be suitable for use with LEDs and/or lasers as described in U.S. Pat. Nos. 6,201,262; 6,187,606; 6,120,600; 5,912,477; 5,739,554; 5,631,190; 5,604,135; 5,523,589; 5,416,342; 5,393,993; 5,338,944; 5,210,051; 5,027,168; 5,027,168; 4,966,862 and/or 4,918,497, the disclosures of which are incorporated herein by reference as if set forth fully herein. Other suitable LEDs and/or lasers are described in published U.S. Patent Publication No. U.S. 2003/0006418 A1 entitled Group III Nitride Based Light Emitting Diode Structures With a Quantum Well and Superlattice, Group III Nitride Based Quantum Well Structures and Group III Nitride Based Superlattice Structures, published Jan. 9, 2003, as well as published U.S. Patent Publication No. U.S. 2002/0123164 A1 entitled Light Emitting Diodes Including Modifications for Light Extraction and Manufacturing Methods Therefor. Furthermore, phosphor coated LEDs, such as those described in U.S. application Ser. No. 10/659,241, entitled Phosphor-Coated Light Emitting Diodes Including Tapered Sidewalls and Fabrication Methods Therefor, filed Sep. 9, 2003, the disclosure of which is incorporated by reference herein as if set forth fully, may also be suitable for use in embodiments of the present invention. The LEDs and/or lasers may be configured to operate such that light emission occurs through the mounting substrate. In such embodiments, the mounting substrate may be patterned so as to enhance light output of the devices as is described, for example, in the above-cited U.S. Patent Publication No. U.S. 2002/0123164 A1.

In various embodiments of the present invention, a stacked die process is used to provide for a solder connection between a semiconductor light emitting device (e.g., LED) and a submount and between the submount and a mounting substrate using a same solder temperature range of solder material. For example, a middle temperature solder material may be used for both solder connections and reflow may occur in a single operation to allow formation of both bonds without reflowing an already formed bond from a previous reflow operation. Particular embodiments of the present invention using a flux activated solder connection between the LED and the submount and using a solder paste between the submount and the mounting substrate will now be described. More particularly, the described embodiments are for a high temperature solder material, such as AuSn. However, it will be understood that different combinations of solder materials and applications of flux and solder paste fall within the scope of the present invention and that these particular embodiments are described to facilitate understanding of the present invention by those of ordinary skill in the art.

Figure 1B:
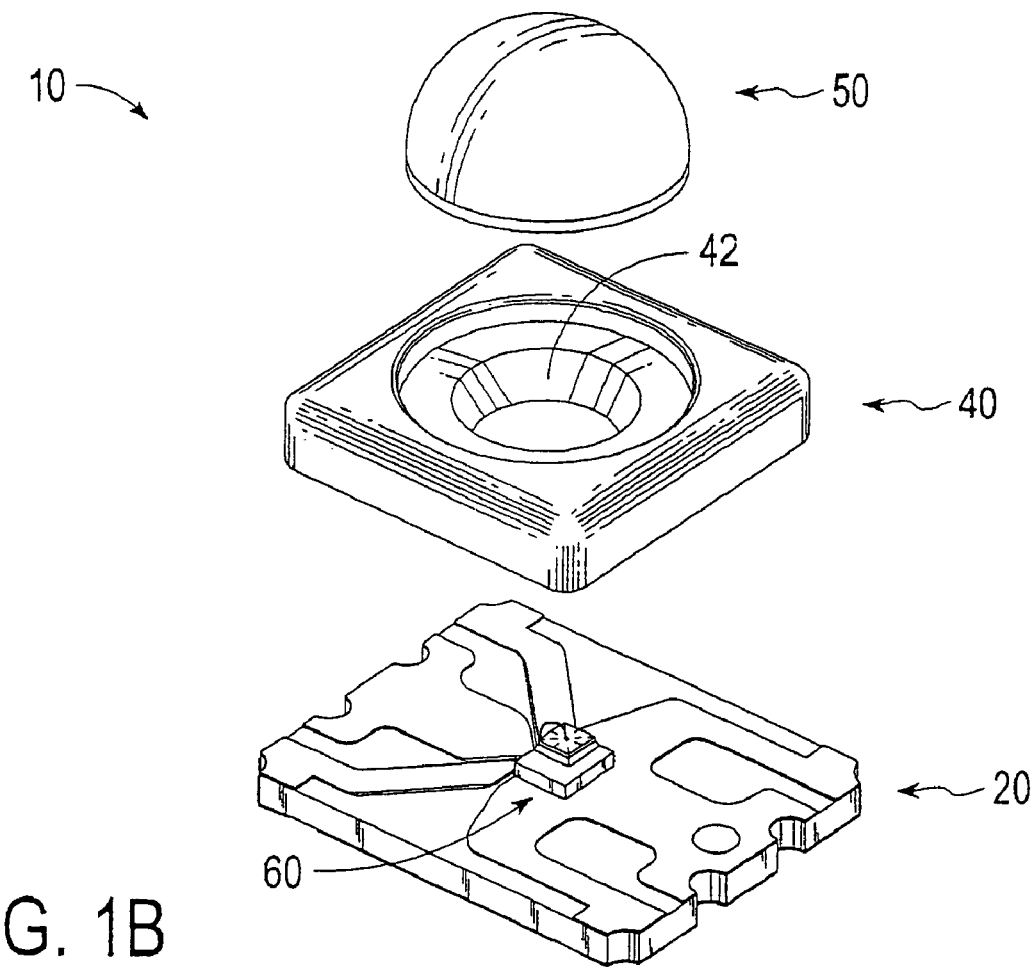
FIG. 1B is an exploded perspective view of the semiconductor die package of FIG. 1A.

FIGS. 1A-1B and 2A-2C illustrate an LED, submount and mounting substrate arrangement that will be referred to in describing the methods of the present invention. FIG. 1A is a perspective view of a semiconductor die package 10 that may be soldered according to some embodiments of the present invention and FIG. 1B is an exploded perspective view of the semiconductor package of FIG. 1A. Referring to FIGS. 1A and 1B, the illustrated light emitting die package 10 includes a mounting substrate 20, a reflector 40 and a lens 50. The mounting substrate 20 and the reflector 40 may further act as heat sinks for an LED assembly 60 mounted on the mounting substrate 20. While the assembly 60 is described herein as including an LED die 66, it will be understood that embodiments of the present invention may also be used with other types of semiconductor light emitting devices.

Figures 2A, 2B:
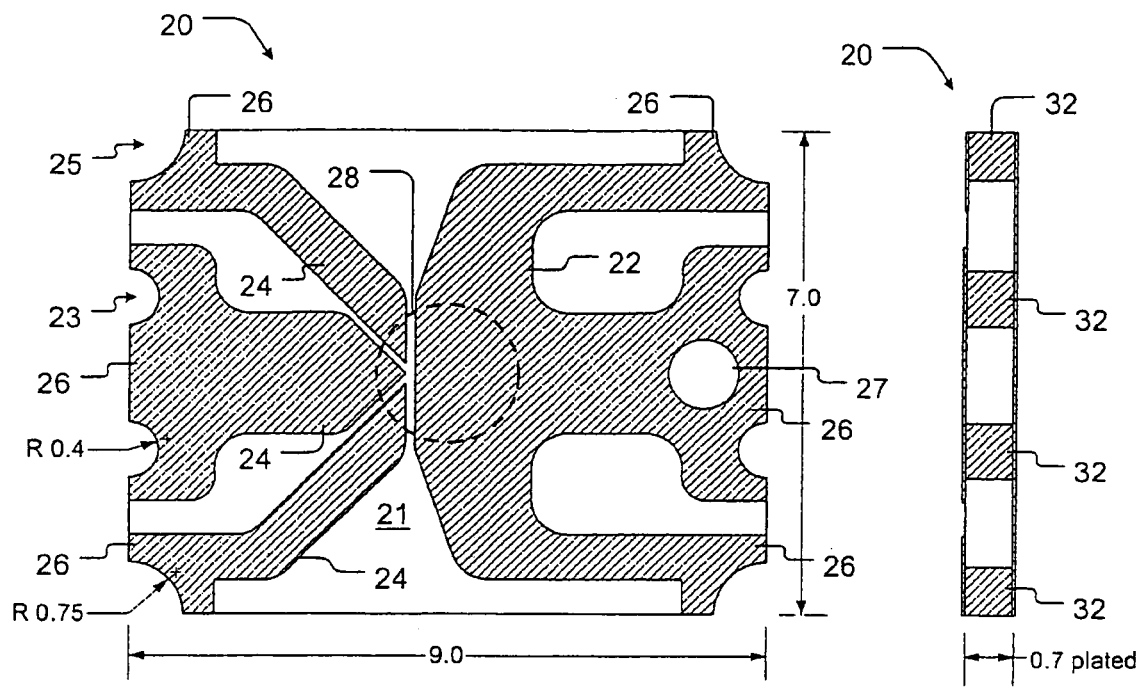
FIG. 2A is a top plan view of a portion of the semiconductor die package of FIG. 1A.
FIG. 2B is a side view of a portion of the semiconductor die package of FIG. 1A.
Figure 2C:
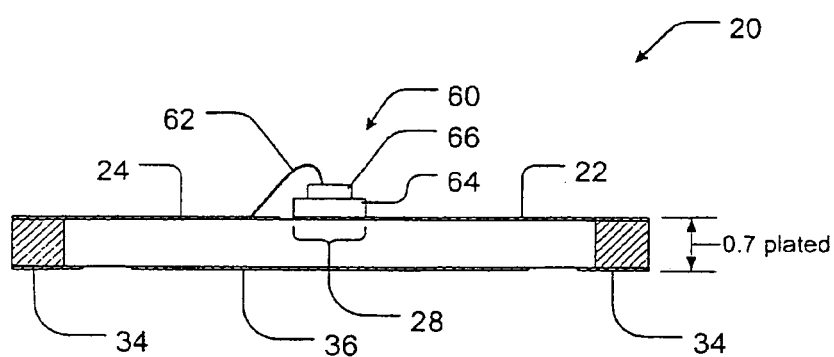
FIG. 2C is a front view of a portion of the semiconductor die package of FIG. 1A.

The mounting substrate 20 is illustrated in more detail in FIGS. 2A through 2C. FIGS. 2A, 2B and 2C provide, respectively, a top view, a side view and a front view of the mounting substrate 20 of FIG. 1A. Further, FIG. 2C also shows the LED assembly 60 in addition to the front view of the mounting substrate 20. The LED assembly 60 is also illustrated in FIG. 1B. Referring to FIGS. 1A through 2D, the mounting substrate 20 may provide support for electrical traces 22 and 24; for solder pads 26, 32, 34 and 36; and for the LED assembly 60. In the figures, to avoid clutter, only representative solder pads 26, 32, and 34 are indicated with reference numbers. The traces 22 and 24 and the solder pads 32, 34 and 36 can be fabricated using conductive material. Further, additional traces and connections can be fabricated on the top, side, or bottom of the mounting substrate 20, or layered within the mounting substrate 20. The traces 22 and 24, the solder pads 26, 32, 34 and 36, and other connections can be interconnected to each other in a variety of combinations using known methods, for example, via holes.

The mounting substrate 20 may be made of a material having high thermal conductivity but that is electrically insulating, for example, aluminum nitride (AlN) or alumina ($Al_2O_3$). Dimensions of the mounting substrate 20 can vary widely depending on application and processes used to manufacture the die package 10. For example, in the illustrated die package 10, the mounting substrate 20 may have dimensions ranging from fractions of millimeters (mm) to tens of millimeters. Although the present invention is not limited to die packages of particular dimensions, one specific die package 10 is illustrated in the figures having various exemplary dimensions denoted therein. Dimensions shown in the figures are in millimeters (for lengths, widths, heights, and radii) and degrees (for angles) except as otherwise designated in the figures or otherwise herein.

The mounting substrate 20 in the illustrated die package 10 has a top surface 21, the top surface 21 including the electrical traces 22 and 24. The traces 22 and 24 provide electrical connections from the solder pads (for example top solder pads 26) to a mounting pad 28. The top solder pads 26 are portions of the traces 22 and 24 generally proximal to sides of the mounting substrate 20. The top solder pads 26 are electrically connected to side solder pads 32. The mounting pad 28 is a portion of the top surface (including portions of the trace 22, the trace 24, or both) where the LED assembly 60 is mounted. The mounting pad 28 may be located proximal to center of the top surface 21.

The traces 22 and 24 provide electrical routes to allow the LED assembly 60 to electrically connect to the solder pads 26, 32, 34 and/or 36. Accordingly, some of the traces are referred to as first traces 22 herein while other traces are referred to as second traces 24. In the illustrated die package 10, the mounting pad 28 includes portions of both the first traces 22 and the second traces 24. As shown in the figures, the LED assembly 60 is placed on the first trace 22 portion of the mounting pad 28 thereby making contact with the first trace 22. The top of the LED assembly 60 and the second traces 24 are illustrated as connected to each other via a bond wire 62. Depending on the construction and orientation of LED assembly 60, the first traces 22 may provide anode (positive) connections and second traces 24 may provide cathode (negative) connections for the LED assembly 60 (or vice versa).

The LED assembly 60 can include additional elements. For example, in FIGS. 1B and 2C, the LED assembly 60 is illustrated including the LED bond wire 62, an LED submount 64 and a light emitting diode (LED) die 66. Multiple bond wires may be used in other mounting configurations. The mounting pad 28 can be configured for mounting of a flip-chip arrangement of the LED assembly 60. Additionally, multiple LED assemblies can be mounted on the mounting pad 28. The LED assembly 60 may also be mounted over multiple traces. The traces 22 and 24 may be made of conductive material such as gold, silver, copper, tin and/or other metals. The traces 22 and 24 can have dimensions as illustrated in the figures and have thickness in the order of microns or tens of microns depending on application. For example, the traces 22 and 24 can be 15 microns thick. FIGS. 1A and 2A illustrate an orientation marking 27. Such markings can be used to identify the proper orientation of the die package 10 even after assembling the die package 10. The orientation marking 27 need not be a via or a through hole. The traces 22 and 24, as illustrated, can extend from the mounting pad 28 to sides of the mounting substrate 20.

Continuing to refer to FIGS. 1A through 2C, the illustrated mounting substrate 20 defines semi-cylindrical spaces 23 and quarter-cylindrical spaces 25 proximal to its sides. In the figures, to avoid clutter, only representative spaces 23 and 25 are indicated with reference numbers. The semi-cylindrical spaces 23 and the quarter-cylindrical spaces 25 may provide spaces for solder to flow-through and solidify in when the die package 10 is attached to a printed circuit board (PCB) or another apparatus (not shown) to which the die package 10 is a component thereof. Moreover, the semi-cylindrical spaces 23 and the quarter-cylindrical spaces 25 may provide convenient delineation and break points during the manufacturing process.

Figure 2D:
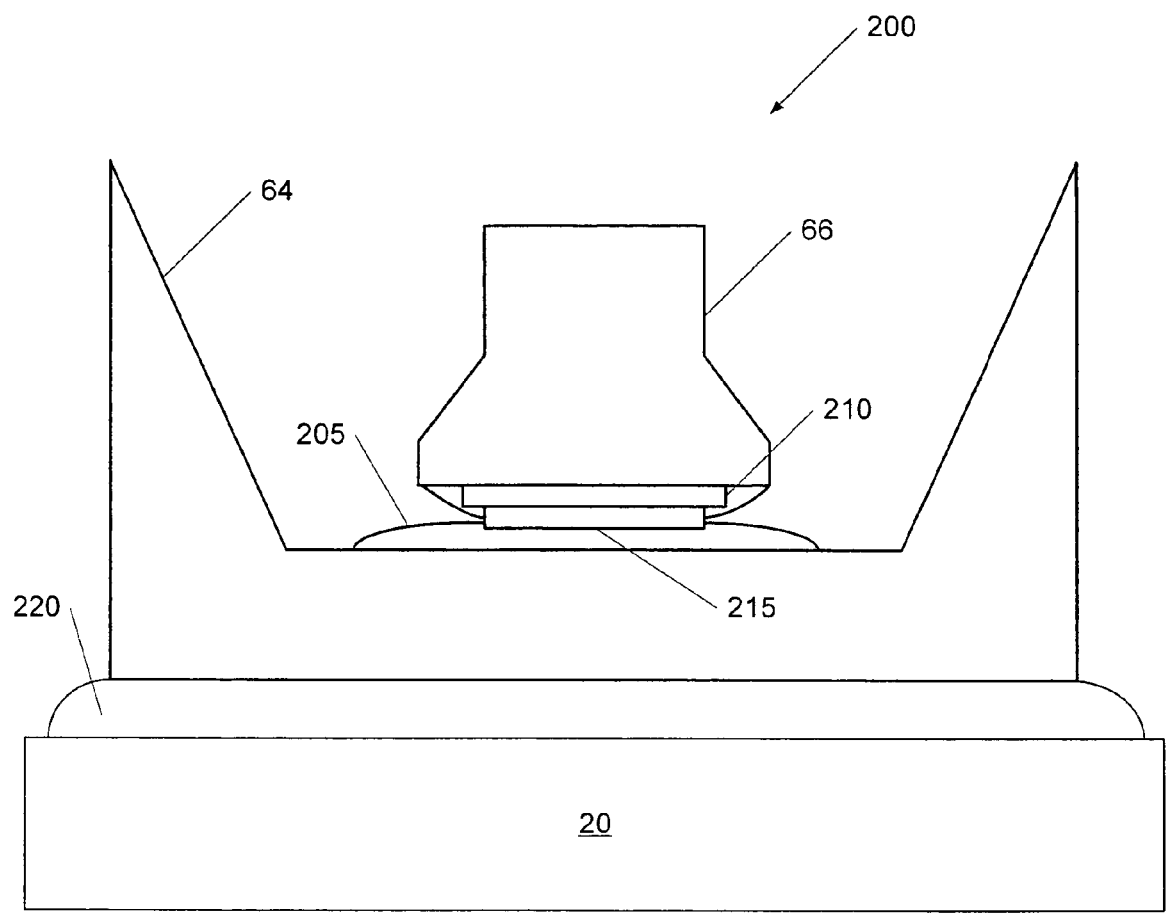
FIG. 2D is a side view of a semiconductor light emitting device assembled stack before reflowing according to some embodiments of the present invention.

FIG. 2D is a schematic side view of a semiconductor light emitting device assembled stack according to some embodiments of the present invention before reflowing the same. As shown in FIG. 2D, the assembled stack 200 includes the LED die 66, the submount 64 and the mounting substrate 20. The LED die 66 includes an epitaxial layer or layers 210. As will be understood by those of skill in the art, additional features such as ohmic contacts, a metal mirror layer or the like may be provided on epitaxial layers 210. Such additional layers are further described, for example, in U.S. patent application Ser. No. 10/200,244, which has been incorporated by reference above.

The LED die 66 illustrated in FIG. 2D is a high temperature solder terminated semiconductor light emitting device including a high temperature solder layer 215, such as an AuSn termination layer. The LED die 66 is positioned on the submount 64 with a flux dot 205 therebetween to facilitate the formation of a metal to metal bond between the LED die 66 and the submount 64. Also shown for the embodiments of FIG. 2D is a high temperature solder paste 220, such as an AuSn solder paste, between the mounting substrate 20 and the submount 64 to provide a metal to metal bond between the submount 64 and the mounting substrate 20. Following heating, it will be understood that the flux 205 and the flux in the solder paste 220 will be removed to provide a reflowed assembled stack. While generally described herein with reference to embodiments where a solder paste is used between the submount and the mounting substrate and a flux is positioned between the submount an LED die with a solder material deposited thereon, it is to be understood that the present invention is not so limited. For example, a solder paste may be used between the LED die and the submount and/or a flux in combination with a solder material deposited on the submount or the mounting substrate may be used between the submount and the substrate. Similarly, the solder material may be deposited on either or both of the components being bonded.

Embodiments of the present invention will now be further described with reference to the various embodiments illustrated in the flowchart illustrations of FIGS. 3 and 4 and the schematic illustration of FIG. 5. For the purposes of understanding the present invention, the description of FIGS. 3 and 4 will be based on use of a solder paste, which includes both solder material and flux, as the solder material and flux positioned between the submount and the mounting substrate and a flux positioned adjacent a deposited material layer for the submount to the light emitting device interface. However, it will be understood that other combinations may be used in accordance with embodiments of the present invention, including use of a solder paste to provide the solder material and the flux in either, both or none of the bond regions.

Figure 3:
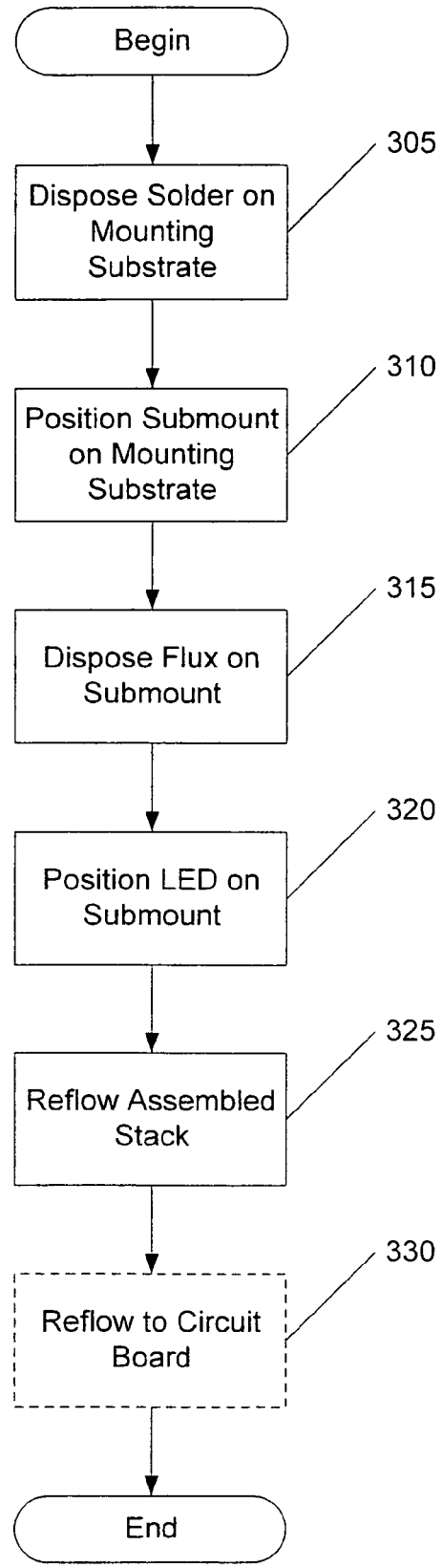
FIG. 3 is a flowchart illustrating operations for assembly for a semiconductor light emitting device package according to some embodiments of the present invention.

Referring first to the embodiments illustrated by the flow chart diagram of FIG. 3, operations begin at Block 305 by disposing a solder paste on a mounting substrate. The solder paste may be a high temperature solder material, such as an AuSn solder paste. A submount is positioned on the mounting substrate with the solder paste therebetween (Block 310). A flux is disposed on a top side of the submount displaced from the mounting substrate (Block 315). The semiconductor light emitting device is positioned on the top side of the submount with the flux therebetween (Block 320).

As described with reference to FIG. 2D, the semiconductor light emitting device may have a solder material on a side thereof contacting the flux. The positioned submount, semiconductor light emitting device, solder paste and flux define an assembled stack that has not been reflowed. The assembled stack is then reflowed to attach the submount to the mounting substrate and the light emitting device to the submount (Block 325). Operations at Block 325 may include reflowing the assembled stack by heating in an oven to a temperature and at a rate selected to provide a metal to metal bond between the mounting substrate and the submount and between the submount and the light emitting device. Both the metal to metal bonds may be high temperature solder bonds and the solder material on the light emitting device may be a high temperature solder material, such as AuSn. In such embodiments, the temperature of the solder material for reflow may be at least about 300° C. Both a mechanical and an electrical connection may be provided by the metal to metal bonds. For example, the solder paste may be disposed on a contact pad on a top side of a mounting substrate and a flux may be placed as a flux dot on a contact pad on the top side of the submount.

As further shown in the embodiments of FIG. 3, additional processing steps may optionally be carried out to incorporate the reflowed assembled stack in particular application environments. The subsequent operations may include soldering the reflowed assembled stack to a circuit board without reflowing attachment of the submount to the mounting substrate or the light emitting device to the submount using a medium or low temperature solder reflow process (Block 330).

Referring now to the flow chart illustration of FIG. 4 and the schematic block diagram illustration of FIG. 5, further exemplary embodiments of the present invention will now be described. The methods for assembly of a semiconductor light emitting device package illustrated in the flow chart of FIG. 4 will be generally described with reference to the assembly apparatus illustrated schematically in FIG. 5. Operations begin for the embodiments of FIG. 4 at Block 405 by providing a mounting substrate, a high temperature solder backed side terminated submount, a high temperature solder terminated semiconductor light emitting device, a high temperature solder paste and a solder flux to a pick and place assembly apparatus 505. As illustrated in FIG. 5, the semiconductor light emitting devices may be provided to the pick and place apparatus 505, for example, on a carrier tape and the light emitting devices may be in form of LED dies. In various embodiments of the present invention, the submounts are AuSn backside terminated submounts and the semiconductor light emitting devices are AuSn terminated LEDs which may be presented on a carrier tape epitaxial side (epi-side) up. In such embodiments, the solder paste may be an AuSn solder paste and an appropriate flux may be provided for use with the AuSn terminated LEDs.

Various operations performed by the pick and place apparatus 505 will now be described with reference to the flow chart illustration of FIG. 4. The high temperature solder paste is dispensed on a top surface of the mounting substrate (Block 410). The submount is placed with a bottom face thereof on the mounting substrate with the dispensed solder paste therebetween (Block 415). The flux is dispensed, for example, as a flux dot, on a top face of the submount (Block 420). The semiconductor light emitting device is placed on the submount with the flux therebetween (Block 425). As described for various embodiments above, the light emitting device may have a high temperature solder material deposited on a face thereof contacting the dispensed flux to provide, in combination with the mounting substrate and the submount, an unsoldered assembled stack.

Figure 5:
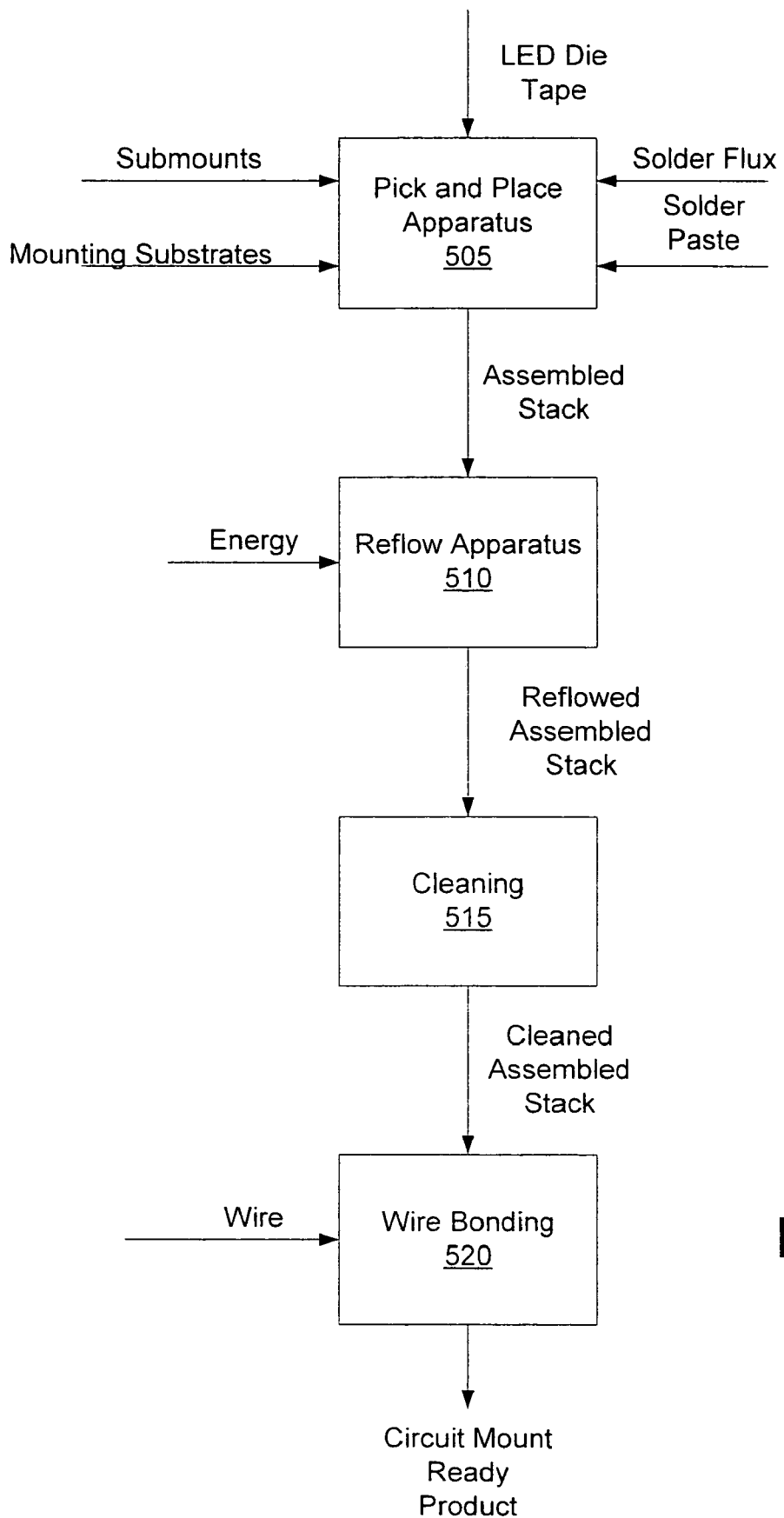
FIG. 5 is a schematic block diagram of a semiconductor light emitting device assembly apparatus suitable for use in carrying out methods according to some embodiments of the present invention.

As shown in FIG. 5, the assembled stack is provide to a reflow apparatus 510. For example, the reflow apparatus 510 may be a reflow oven to which the assembled stack has been provided for heating (Block 430). The reflow apparatus 510 introduces energy to generate heat to reflow the assembled stack (Block 435). Thus, various embodiments of the present invention may utilize a stack die assembly process followed by a single reflow to form a high temperature solder junction for both the semiconductor light emitting device attachment to a submount and attachment of the submount to an underlying mounting substrate. As a result, a high temperature metal solder attachment may be provided between each of the light emitting device, submount and mounting substrate components. Furthermore, in some embodiments of the present invention, use of a single reflow process may provide a less expensive simpler and higher yielding manufacturing process.

In previous assembly processes, to provide both the light emitting device to submount and submount to mounting substrate with high temperature solder/metal attachment, the die was subjected to two reflows at temperatures of about 300° C., which may cause damage or deterioration of the bonds and/or components, such as a LED die. The reflow twice process may also reduce metallurgical soundness of the joint subjected to reflow two times. By having the semiconductor light emitting device to submount and submount to mounting substrate junctions both high temperature solder attached, subsequent reflow operations, for example, to attach the mounting substrate on a circuit board, may be at a middle temperature reflow, such as with Sn or AgSn solder material, which may then be stable for purposes of going through further processing at low temperature reflows, such as PbSn solder material reflows, which is an industry standard for soldering components to circuit boards. Furthermore, as lead-free mandates become more common, a dual high temperature bonded stacked die assembly may also be stable for use with middle temperature reflow processes for attachment of the assembly to an underlying circuit board.

Figure 4:
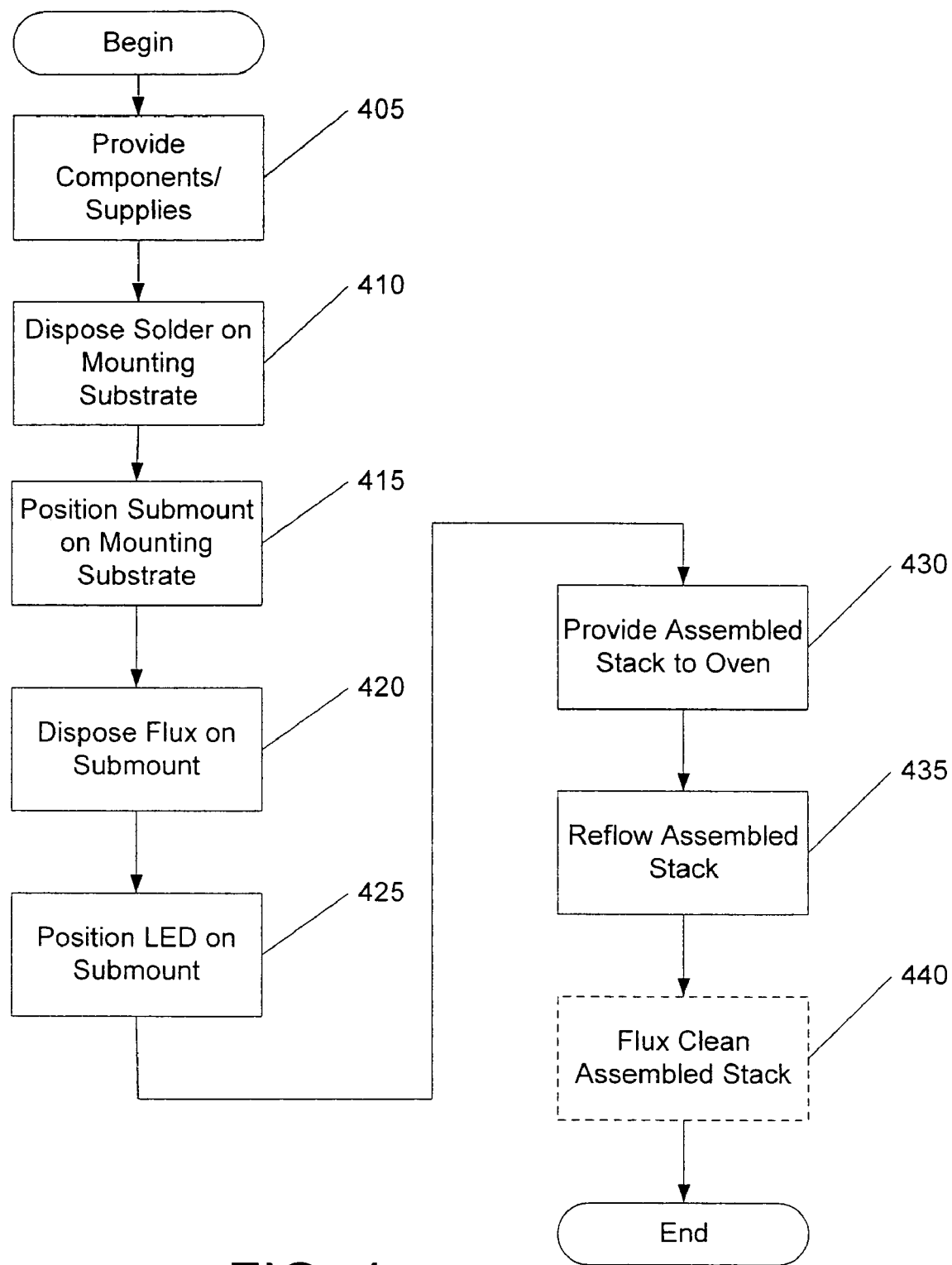
FIG. 4 is a flowchart illustrating operations for assembly for a semiconductor light emitting device package according to some embodiments of the present invention.

As also shown in FIG. 4 and FIG. 5, additional operations may be performed after reflowing of the assembled stack in various embodiments of the present invention. For example, the reflowed assembled stack from the reflow apparatus 510 may be provided to a cleaning apparatus 515 for flux cleaning (Block 440). In addition, as shown in FIG. 5, the cleaned assembled stack may be further processed by, for example, a wire bonding apparatus 520 to complete circuit connections of the semiconductor light emitting device and submount to the mounting substrate to provide a circuit mount ready final product. As illustrated by FIG. 2D, it will be understood that the method of the present invention may be applied to flip chip mounting of light emitting devices and operations performed by the pick and place apparatus in positioning such a light emitting device may include flipping the light emitting device before placing the light emitting device on a submount.

As previously indicated, the methods of FIGS. 3 and 4 utilizing the assembly apparatus of FIG. 5 may provide cheaper, simpler and higher yielding processing. For example, a single reflow operation as described above may require less equipment in the immediate assembly area, such as only a single reflow oven and a single flux cleaning station may be required as contrasted with the two of each that may be required for conventional two reflow step operations for the same throughput. Desegregation of operations that are generally not part of an assembly and test line, such as mounting and processing of wafers for dicing, may also be provided. Furthermore, yield may be enhanced as broken blades and the like resulting from dicing and handling may occur earlier in the process on lower value materials so that the effects caused by damage from errors during manufacturing may be reduced and may be more readily detected by the pick and place apparatus 505.

Particular methods suitable for use in proper placement of a light emitting device using a pick and place apparatus will now be further described with reference to FIG. 6. As will be understood by those of skill in the art, the methods of placement of a semiconductor light emitting device on a mounting surface, such as a submount, illustrated in FIG. 6, may be used by the pick and place apparatus 505 in connection with the various operations described with reference to FIGS. 3 and 4. However, other embodiments of methods of assembly for a semiconductor light emitting device may be used with the present invention and further, the placement methods described with reference to FIG. 6 may be beneficially utilized in placement of the semiconductor light emitting device in applications where the stack die assembly methods described above are not utilized.

Figure 6:
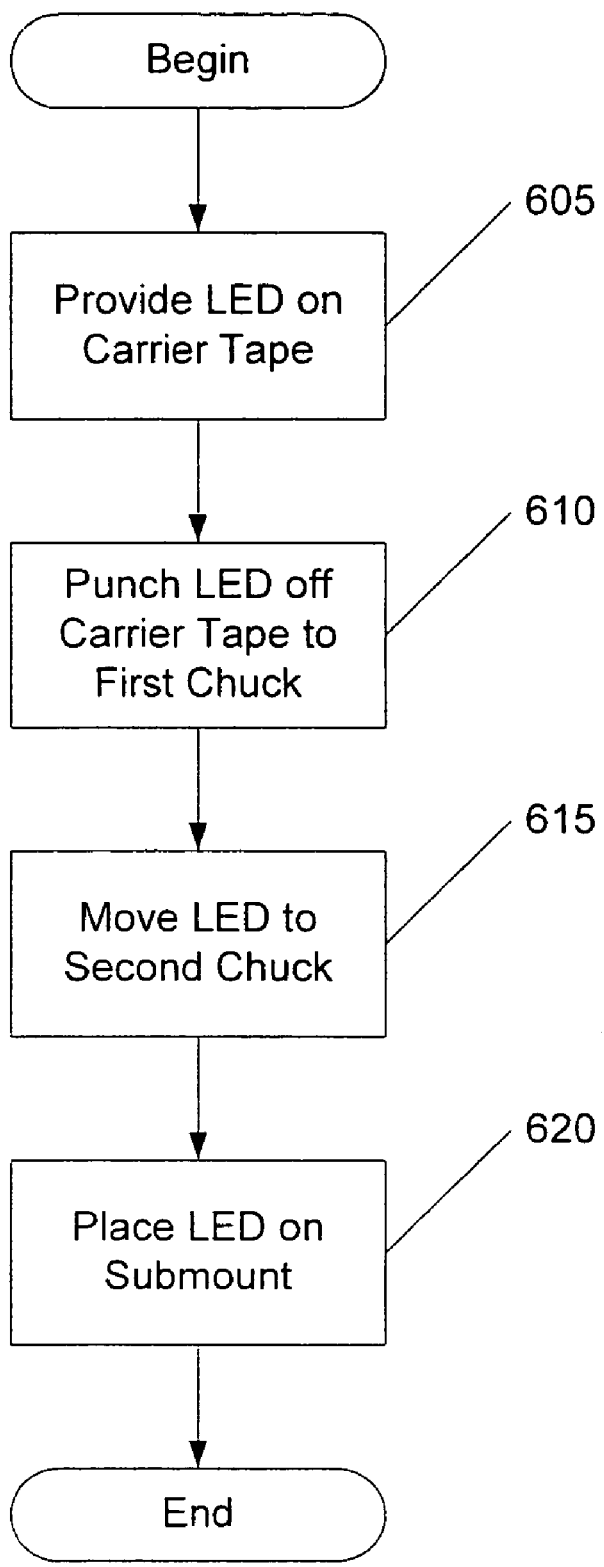
FIG. 6 is a flowchart illustrating operations for positioning of a flip-chip configuration semiconductor light emitting device according to some embodiments of the present invention.

As shown in FIG. 6, operations begin at Block 605 by providing the semiconductor light emitting device positioned on a carrier tape with an epitaxial layer side of the light emitting device facing up (i.e., away from the carrier tape). The light emitting device is punched off the carrier tape to first chuck (collett) with a punch pin without contacting the epi-layer side of the light emitting device with the punch pin (Block 610). The light emitting device is moved from the first chuck to a second chuck (collett) to flip the light emitting device (Block 615). The light emitting device is placed on the mounting surface, such as a submount, with the second chuck (Block 620).

As described above, flip chip handling of semiconductor light emitting devices, such as LEDs, may be improved by various embodiments of the present invention. It is known that a chipped ejector pin, a small diameter tip ejector pin or a high force ejection process can cause damage to an LED by causing microcracks in the metal structure, which may result in compromise or degradation of an ohmic contact to an eptixial layer. By using the flip chip pick and place action described with reference to FIG. 6, the risk of such damage to the LED may be reduced, which in turn may result in higher reliability test results. In addition, thermal conductivity is generally considered an important parameter when working with large area LEDs. The embodiments described above with reference to FIGS. 3 and 4 may provide improved thermal conductivity characteristics by using a high temperature solder material metal interface between each component of a stack, such as an AuSn/AuSn metal interface combination. Performance of such an arrangement may be further enhanced by using a flux/flux processing of the stack, which may be suitable when a metal leadframe is used with the mounting substrate as the thickness of the terminal junction may be reduced. The high temperature metal terminations may provide for both a high temperature package solution for downstream stability during later processing and may minimize high temperature stress introduced thereto by eliminating a reflow cycle as compared with a two step process.

The methods described above may also beneficially incorporate high precision placement accuracy as currently known placement vision systems may be optimized for one component pattern recognition and may have less trouble than when trying to place a subassembly. Thus, placement accuracy may be provided with a stacked die process. There may also be a reduction in cleaning provided and, possibly, even a no-cleaning process as a flux-flux process may be optimized to use minimal flux or a no-clean flux. The capital investment in manufacturing equipment may also be reduced both by a reduction in the number of oven and cleaning stations as well as a potential reduction in the computer equipment utilized to control the same. This may further result in the benefit of factory floor space requirement reductions as well as power, facility and chemical delivery logistics and infrastructure benefits. The metallurgy of the solder metal to metal connection may also be more controlled with the reduction in concern of the impact of subsequent reflow profiles as such could cause grain growth and/or changes in stresses when applied after the first reflow. Using a stacked die approach as described above, subsequent reflows are generally aimed at a reflow joint location that is displaced at a greater distance from the semiconductor light emitting device and such later processes may thereby be more easily managed to reduce temperature excursions caused to the semiconductor light emitting device.

It will be understood that various process parameter specifications during reflow, such as heating in the reflow oven 510, may beneficially improve process performance. For example, the amount of flux dispensed between the semiconductor light emitting device and the submount and the rate of heating may be selected to prevent boiling, which may launch the semiconductor light emitting device off the submount during processing, while still providing for reflow to form a non-oxidized metal to metal bond before evaporation of all the flux positioned between the submount and the light emitting device. The risk of oxidation at the bond may also be further reduced by using a nitrogen atmosphere in the reflow oven 510 to remove oxygen from the vicinity of the assembled stack during the reflow operation. In some embodiments of the present invention, the amount of flux dispensed may be reduced when a nitrogen atmosphere is provided in the reflow oven. An exemplary combination of operating conditions suitable for use with various embodiments of the invention will now be provided. The dispensed flux dot for this example is provided of a diameter sufficient to fully wet the surface to be soldered. For various LED applications, a suitable flux dot diameter of from about 400 micrometers to about 700 micrometers is used, such as a 550 micrometer flux dot. Paste coverage is also selected to provide sufficient paste to cover the area to be soldered. An "X" pattern or a "line" pattern may be used with, for example, a length of about 1000 micrometers and a width of about 200 micrometers of AuSn solder paste. However, a significant variation in size may be used for the solder paste as more may increase bond line thickness and less may reduce the amount of pressure used to push a submount/device into the paste. A dot solder paste, for example, of an 800 micrometer diameter, may be used through a full "X," for example, with each leg being about 1 millimeter in length and about 400 micrometers wide. If a paste is used with better wetting qualities than AuSn, such as many medium and low temperature solders, then less may be needed as the solder wets during molten reflow processing. Note that in a nitrogen environment less oxide growth may occur and, thus, better and more consistent wetting and easier cleaning of flux residues may result.

The flowcharts of FIGS. 3, 4 and 6 and the schematic illustration of FIG. 5 illustrate the functionality and operation of possible implementations of methods for assembly of semiconductor light emitting devices and/or placement of such devices on a submount according to some embodiments of the present invention. It should be noted that, in some alternative implementations, the acts noted in describing the figures may occur out of the order noted in the figures. For example, two blocks/operations shown in succession may, in fact, be executed substantially concurrently, or may be executed in the reverse order, depending upon the functionality involved.

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

That which is claimed is:

1. A method of assembly for a semiconductor light emitting device package, comprising:
    positioning a submount on a mounting substrate with a solder material and a flux therebetween;
    positioning the semiconductor light emitting device on a top side of the submount with a solder material and a flux therebetween to provide an assembled stack that has not been reflowed; and
    reflowing the assembled stack to attach the submount to the mounting substrate and the light emitting device to the submount.

2. A method of claim 1 wherein:
    positioning a submount on a mounting substrate with a solder material and a flux therebetween comprises positioning a submount on a mounting substrate with a solder paste therebetween; and
    positioning the semiconductor light emitting device on a top side of the submount with a solder material and a flux therebetween includes forming a solder material layer on at least one of the semiconductor light emitting device and the top side of the submount.

3. The method of claim 2 further comprising:
    disposing the solder paste on the mounting substrate; and
    disposing the flux on the top side of the submount, displaced from the mounting substrate, wherein the flux contacts the solder material layer.

4. The method of claim 3 wherein reflowing the assembled stack comprises heating the assembled stack in an oven to a temperature and at a rate selected to provide a metal to metal bond between the mounting substrate and the submount and between the submount and the light emitting device.

5. The method of claim 4 wherein the metal to metal bonds comprise high temperature solder bonds.

6. The method of claim 5 wherein the solder paste comprises a gold-tin (AuSn) solder paste and wherein the solder material on the light emitting device comprises AuSn.

7. The method of claim 6 wherein the temperature is at least about 300° C.

8. The method of claim 7 wherein the light emitting device comprises a light emitting diode (LED).

9. The method of claim 3 wherein reflowing the assembled stack is followed by soldering the reflowed assembled stack to a circuit board without reflowing attachment of the submount to the mounting substrate or of the light emitting device to the submount using a medium or low temperature solder.

10. The method of claim 3 wherein disposing a solder paste comprises disposing the solder paste on a contact pad on a top side of the mounting substrate.

11. The method of claim 3 wherein disposing a flux comprises placing a flux dot on a contact pad on the top side of the submount.

12. The method of claim 1 wherein reflowing the assembled stack comprises heating the assembled stack in an oven to a temperature and at a rate selected to provide a metal to metal bond between the mounting substrate and the submount and between the submount and the light emitting device.

13. The method of claim 12 wherein the metal to metal bonds comprise high temperature solder bonds.

14. The method of claim 13 wherein positioning a submount on a mounting substrate with a solder material and a flux therebetween comprises positioning a submount on a mounting substrate with a solder paste therebetween and wherein the solder paste comprises a gold-tin (AuSn) solder paste and wherein the solder material between the light emitting device and the submount comprises AuSn.

15. The method of claim 12 wherein the temperature is at least about 300° C.

16. The method of claim 1 wherein the light emitting device comprises a light emitting diode (LED).

17. The method of claim 1 wherein reflowing the assembled stack is followed by soldering the reflowed assembled stack to a circuit board without reflowing attachment of the submount to the mounting substrate or of the light emitting device to the submount using a medium or low temperature solder.

18. A method of assembly for a semiconductor light emitting device package, comprising:
   providing a mounting substrate, a high temperature solder backside terminated submount, a high temperature solder terminated semiconductor light emitting device, a high temperature solder paste and a solder flux to a pick and place assembly apparatus;
   wherein the following operations are performed by the pick and place apparatus:
   dispensing the high temperature solder paste on the mounting substrate;
   placing the submount with a bottom face thereof on the mounting substrate with the dispensed solder paste therebetween;
   dispensing the flux on a top face of the submount;
   placing the light emitting device on the submount with the flux therebetween, the light emitting device having a high temperature solder material deposited on a face thereof contacting the dispensed flux to provide an unsoldered assembled stack; and then
   providing the assembled stack for heating in a reflow oven; and
   wherein the following operation is performed by the reflow oven:
   reflowing the assembled stack.

19. The method of claim 18 wherein reflowing the assembled stack is followed by flux cleaning the reflowed assembled stack.

20. The method of claim 18 wherein placing the light emitting device includes flipping the light emitting device before placing the light emitting device on the submount.

21. The method of claim 20 wherein the light emitting device is provided to the pick and place machine on a carrier tape.

22. The method of claim 21 wherein the light emitting device is positioned on the carrier tape with an epi-layer side thereof up and wherein placing the light emitting device includes punching the light emitting device off the carrier tape to a first chuck with a punch pin without contacting the epi-layer side of the light emitting device with the punch pin;
   moving the light emitting device from the first chuck to a second chuck to flip the light emitting device; and
   placing the light emitting device on the submount with the second chuck.

* * * * *